United States Patent
Kim

(10) Patent No.: US 7,030,691 B2
(45) Date of Patent: Apr. 18, 2006

(54) POWER AMPLIFIER

(75) Inventor: Hong Teuk Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 49 days.

(21) Appl. No.: 10/830,030

(22) Filed: Apr. 23, 2004

(65) Prior Publication Data

US 2004/0212437 A1 Oct. 28, 2004

(30) Foreign Application Priority Data

Apr. 26, 2003 (KR) .................. 10-2003-0026562

(51) Int. Cl.
*H03F 1/14* (2006.01)
*H03F 3/68* (2006.01)
*H03F 3/191* (2006.01)

(52) U.S. Cl. ............. 330/51; 330/124 R; 330/302
(58) Field of Classification Search .......... 330/51, 330/124 R, 295, 302
See application file for complete search history.

(56) References Cited

U.S. PATENT DOCUMENTS 5,256,987 A * 10/1993 Kibayashi et al. .......... 330/295

* cited by examiner

*Primary Examiner*—Steven J. Mottola
(74) *Attorney, Agent, or Firm*—Birch, Stewart, Kolasch & Birch, LLP

(57) ABSTRACT

A power amplifier for enhancing output efficiency. The power amplifier includes a first amplifier connected to a first power, a second amplifier connected to a second power, a common input impedance matching unit impedance matching inputted signals and outputting the inputted signals to the first amplifier and the second amplifier, a common output impedance matching unit impedance matching and outputting the signals amplified from the first amplifier and the second amplifier, an output impedance matching unit electrically connected between the first amplifier and the common output impedance matching unit, and modifying an output voltage value of the first amplifier to an output voltage value of the second amplifier, and an input impedance matching unit electrically connected between the common input impedance matching unit and the first amplifier, and compensating a phase shift occurring during the voltage modification of the output impedance matching unit.

20 Claims, 4 Drawing Sheets

POWER AMPLIFIER

CROSS-REFERENCE TO RELATED APPLICATIONS

This application claims the benefit of Korean Application No. P2003-026562, filed on Apr. 26, 2003, which is hereby incorporated by reference as if fully set forth herein.

BACKGROUND OF THE INVENTION

1. Field of the Invention

The present invention relates to an amplifier, and more particularly, to a power amplifier. Although the present invention is suitable for a wide scope of applications, it is particularly suitable for enhancing output efficiency.

2. Discussion of the Related Art

Recently, wireless telecommunication services, such as wireless telephones, wireless local area network (LAN), and so on, are being extensively provided throughout the world. More specifically, wireless mobile telecommunication services, such as the European global system for mobile communication (GSM) 900 in 890–915 MHz, the North American advanced mobile phone service (AMPS) 800 in 824–849 MHz, the U.S. personal communication system (PCS) 1900 in 1850–1910 MHz, the Korean PCS 1900 in 1750–1780 MHz, and so on, are being provided.

Especially, recently developed mobile phones are used in diverse color moving images, which are highly power consuming, through wireless internet services, and so assembly parts requiring low power are on demand by mobile phone and communication service providers. Among wireless mobile phones, the power amplifier of a radio frequency (RF) receiver consumes the largest amount of power.

A method for enhancing the power efficiency of the power amplifier is to operate the power amplifier in a high power mode or a low power mode depending upon the outputted power. Herein, the consumed power is reduced in the lower power mode.

In addition, a zero intermediate frequency (IF) conversion circuit or a direct conversion circuit is adopted in the recent mobile communication system, so as to reduce the number of RF receivers and to reduce the time used in mobile phone development.

In the mobile communication system adopting the IF conversion circuit, a power amplifier having a power gain between the high power mode and the low power mode of about 10 decibels (dB) is required. However, the power amplifier generally used in the present technology has a power gain between the high power mode and the low power mode in the range of about 2 to 3 decibels (dB). Accordingly, a power amplifier having a larger gain difference between the high power mode and the low power mode is required and on demand.

SUMMARY OF THE INVENTION

Accordingly, the present invention is directed to a power amplifier that substantially obviates one or more problems due to limitations and disadvantages of the related art.

An object of the present invention is to provide a power amplifier that can optimize the consumed power efficiency.

Another object of the present invention is to provide a power amplifier that has a large gain difference between a high power mode and a low power mode.

A further object of the present invention is to provide a power amplifier that can control the gain difference between the high power mode and the low power mode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a power amplifier includes a first amplifier connected to a first power, a second amplifier connected to a second power, a common input impedance matching unit impedance matching inputted signals and outputting the inputted signals to the first amplifier and the second amplifier, a common output impedance matching unit impedance matching and outputting the signals amplified from the first amplifier and the second amplifier, an output impedance matching unit electrically connected between the first amplifier and the common output impedance matching unit, and modifying an output voltage value of the first amplifier to an output voltage value of the second amplifier, and an input impedance matching unit electrically connected between the common input impedance matching unit and the first amplifier, and compensating a phase shift occurring during the voltage modification of the output impedance matching unit.

Herein, the second power connected to the second amplifier is switched by a switch and provides an electric current to the second amplifier. The first amplifier is a low power amplifier, and the second amplifier is a high power amplifier.

In addition, the first and second amplifiers are formed of a hetero junction bipolar transistor array, and each of the first and second powers is an electric current source. Alternatively, the first and second amplifiers are also formed of a field effect transistor array, and each of the first and second powers is a voltage source.

Also, the output impedance matching unit is a low pass type impedance matching circuit having a negative phase shift ($-\Phi$), and the input impedance matching unit is a high pass type impedance matching circuit having a positive phase shift ($+\Phi$).

Herein, the output impedance matching unit includes an inductor connected in series between the first amplifier and the common input and output impedance matching units, and a capacitor connected between a node and a ground terminal, the node being formed between the first amplifier and the inductor.

And, the input impedance matching unit includes a capacitor and a resistance connected in series between the common input impedance matching unit and the first amplifier, and an inductor connected between a node and a ground terminal, the node being formed between the capacitor and the resistance.

The output impedance matching unit is a high pass type impedance matching circuit having a positive phase shift ($+\Phi$), and the input impedance matching unit is a low pass type impedance matching circuit having a negative phase shift ($-\Phi$).

Herein, the output impedance matching unit includes a capacitor connected in series between the first amplifier and the common input and output impedance matching units, and an inductor connected between a node and a ground terminal, the node being formed between the first amplifier and the inductor.

Also, the input impedance matching unit includes an inductor and a resistance connected in series between the common input impedance matching unit and the first amplifier, and a capacitor connected between a node and a ground terminal, the node being formed between the inductor and the resistance.

In another aspect of the present invention, a power amplifier includes a low power amplifier connected to a first power, a high power amplifier connected to a second power being switched by a switch, a common input impedance matching unit impedance matching inputted signals and outputting the inputted signals to the low power amplifier and the high power amplifier, a common output impedance matching unit impedance matching and outputting the signals amplified from the low power amplifier and the high power amplifier, a low pass type output impedance matching unit electrically connected between the low power amplifier and the common output impedance matching unit, and having a negative phase shift (−Φ) so as to modify an output voltage value of the low power amplifier to an output voltage value of the high power amplifier, and a high pass type output impedance matching unit electrically connected between the common input impedance matching unit and the low power amplifier, and having a positive phase shift (+Φ) so as to compensate a phase shift occurring during the voltage modification of the output impedance matching unit.

Herein, the output impedance matching unit includes an inductor connected in series between the low power amplifier and the common input and output impedance matching units, and a capacitor connected between a node and a ground terminal, the node being formed between the low power amplifier and the inductor.

Also, the input impedance matching unit includes a capacitor and a resistance connected in series between the common input impedance matching unit and the low power amplifier, and an inductor connected between a node and a ground terminal, the node being formed between the capacitor and the resistance.

In a further aspect of the present invention, a power amplifier includes a low power amplifier connected to a first power, a high power amplifier connected to a second power being switched by a switch, a common input impedance matching unit impedance matching inputted signals and outputting the inputted signals to the low power amplifier and the high power amplifier, a common output impedance matching unit impedance matching and outputting the signals amplified from the low power amplifier and the high power amplifier, a high pass type output impedance matching unit electrically connected between the low power amplifier and the common output impedance matching unit, and having a positive phase shift (+Φ) so as to modify an output voltage value of the low power amplifier to an output voltage value of the high power amplifier, and a low pass type input impedance matching unit electrically connected between the common input impedance matching unit and the low power amplifier, and having a negative phase shift (−Φ) so as to compensate a phase shift occurring during the voltage modification of the output impedance matching unit.

Herein, the output impedance matching unit includes a capacitor connected in series between the low power amplifier and the common input and output impedance matching units, and an inductor connected between a node and a ground terminal, the node being formed between the low power amplifier and the inductor.

Also, the input impedance matching unit includes an inductor and a resistance connected in series between the common input impedance matching unit and the low power amplifier, and a capacitor connected between a node and a ground terminal, the node being formed between the inductor and the resistance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
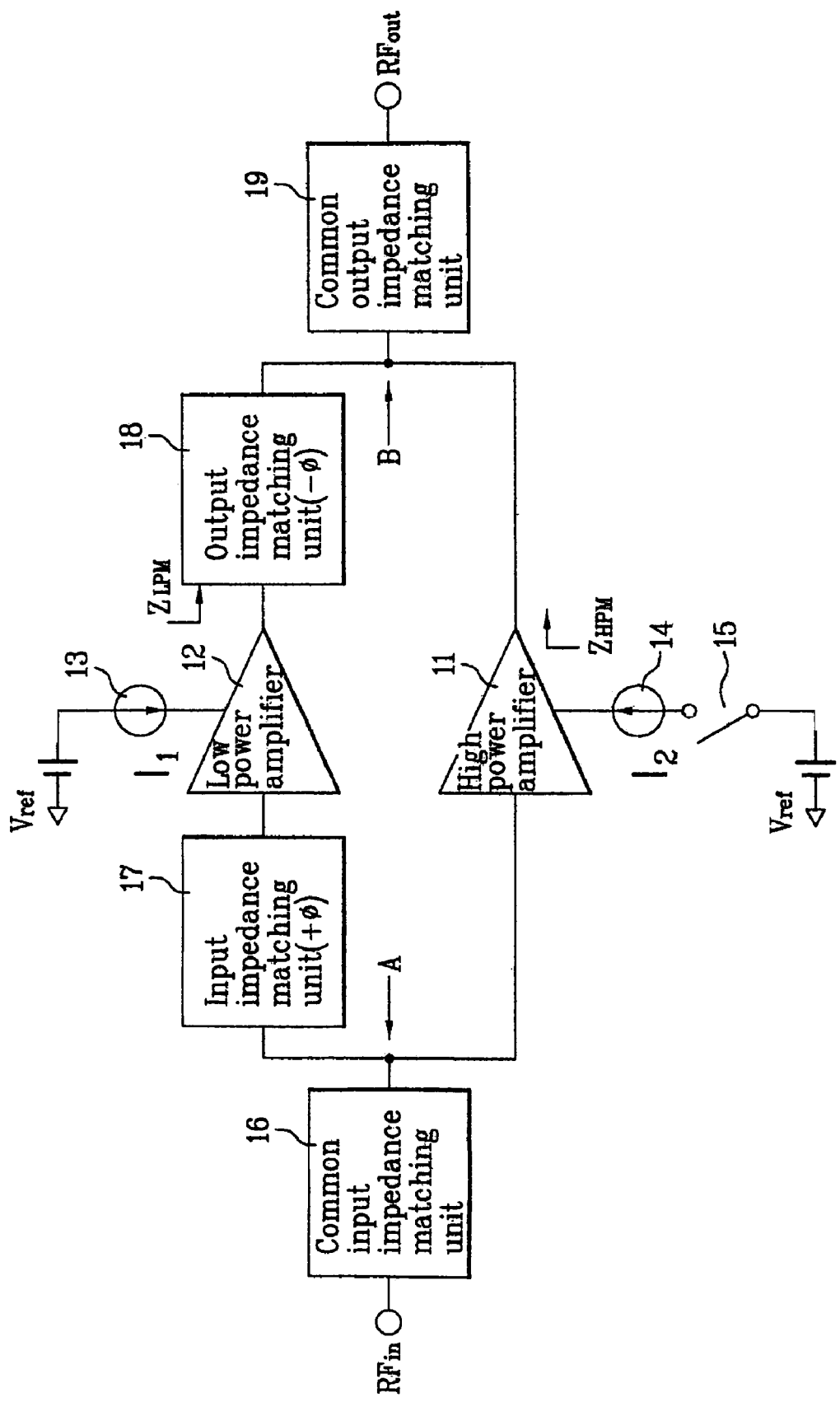
FIG. 1 illustrates a schematic view of a power amplifier according to a first embodiment of the present invention.

FIG. 1 illustrates a schematic view of a power amplifier according to a first embodiment of the present invention.

Referring to FIG. 1, the power amplifier according to the present invention includes a first amplifier and a second amplifier connected to each other in parallel and amplifying the RF input signal. Herein, the first amplifier is a low power mode amplifier 12 and the second amplifier is a high power mode amplifier 11.

In addition, the power amplifier according to the present invention also includes a common input impedance matching unit 16 impedance matching an externally received RF signal and outputting the impedance matched signal to the high power mode amplifier 11 and the low power mode amplifier 12, a common output impedance matching unit 19 matching and outputting the amplified RF signal amplified by the high power mode amplifier 11 and the low power mode amplifier 12, a first power 13 supplying electric current to the low power mode amplifier 12, and a second power 14 supplying electric current to the high power mode amplifier 11.

Herein, the second power 14 can selectively provide electric current to the high power amplifier 11 depending upon the on or off state of a switch 15.

Also, the high power mode amplifier 11 and the low power mode amplifier 12 can be a hetero junction bipolar transistor (HBT) array device or a field effect transistor device. If the high power mode amplifier 11 and the low power mode amplifier 12 are formed of the hetero junction bipolar transistor (HBT), the first power and the second power become the electrical current source. On the other hand, if the high power mode amplifier 11 and the low power mode amplifier 12 are formed of the field effect transistor device, the first power and the second power become the voltage source.

Additionally, the power amplifier of the present invention also includes an input impedance matching unit 17 electrically connected between the common input impedance matching unit 16 and the low power mode amplifier 12 and having a positive phase shifting (+Φ), and an output impedance matching unit 18 electrically connected between the common output impedance matching unit 19 and the low power mode amplifier 12 and having a negative phase shifting (−Φ).

The electric current generated from the first power 13 is applied to the low power mode amplifier 12. And, the electric current generated from the first power 13 is constantly supplied to the low power mode amplifier 12, thereby allowing the low power mode amplifier 12 to continuously perform amplifying operations.

Conversely, the electric current generated from the second power 14 is applied to the high power mode amplifier 11. Herein, the electric current generated from the second power 14 is supplied to the high power mode amplifier 11 depending upon the on or off state of the switch 15. And so, the high power mode amplifier 11 performs the amplifying operations in accordance with the movement of the switch 15.

Herein, the switch 15 is turned on in the high power mode, and the switch 15 is turned off in the low power mode.

More specifically, in the high power mode, both the high power mode amplifier 11 and the low power mode amplifier 12 perform the amplifying operations. And, in the low power mode, only the low power mode amplifier 12 performs the amplifying operations. Accordingly, in the high power mode, the output signal of the high power mode amplifier 11 and the output signal of the low power mode amplifier 12 are simultaneously received at the input terminal B of the common output impedance matching unit 19.

At this point, when the voltage size and phase of the output signal of the high power mode amplifier 11 and the output signal of the low power mode amplifier 12 are different from one another, a signal transmission problem between both amplifiers 11 and 12 may occur.

Therefore, in the high power mode, the input impedance matching unit 17 and the output impedance matching unit 18 match the signal amplified at the high power mode amplifier 11 and the signal amplified at the low power mode amplifier 12 as a signal having the same voltage size and phase.

At this point, between the common input impedance matching unit 16 and the low power mode amplifier 12, the input impedance matching unit 17 phase shifts the output signal of the common input impedance matching unit 16 into a positive phase (+Φ), which is then transmitted to the low power mode amplifier 12.

Also, between the low power mode amplifier 12 and the common output impedance matching unit 19, the output impedance matching unit 18 phase shifts the output signal of the low power mode amplifier 12 into a negative phase (−Φ), which is then transmitted to the common output impedance matching unit 19.

Herein, the phase shift Φ has a positive (+) value, and, in the low power mode, the positive (+) value is a phase shift enabling the output impedance matching unit 18 to reproduce an optimum output impedance. In other words, the phase shift Φ is a phase shift allowing the voltage of the low power mode and the voltage of the high power mode to have the same voltage size and to be identical to each other.

When the high power mode amplifier 11 and the low power mode amplifier 12 are simultaneously operated, the phase shift (−Φ) caused by the output impedance matching unit 18 is shifted to have an opposite phase (i.e., the positive phase (+Φ), thereby making the phase of both output signals identical to each other at the node B.

Phase shifts +Φ and −Φ having the same size but different symbols are formed at the input and output units of the low power mode amplifier 12, so as to easily represent the output impedance matching unit 18 for optimum output impedance of the low power mode amplifier 12 as an L-C impedance matching circuit.

In the power amplifier according to the present invention, the phase shift value Φ is mostly below 90 degrees (90°), and so the L-C value is also small, thereby facilitating the representation of a circuit. The small circuit can be applied to a compact size microwave monolithic integrated circuit (MMIC).

Generally, the negative phase shift (−Φ) occurs when a signal passes through a low pass type impedance matching circuit, and the positive phase shift (+Φ) occurs when a signal passes through a high pass type impedance matching circuit. In addition, the low pass type impedance matching unit and the high pass type impedance matching unit are both included in the present invention, thereby representing the desired impedance and phase shift.

In the high power mode, the high power mode amplifier 11 gains a high power mode output impedance ($Z_{HPM}$) through the common output impedance matching unit 19. And, the low power mode amplifier 12 gains a low power mode output impedance ($Z_{LPM}$) through the output impedance matching unit 18 and the common output impedance matching unit 19.

On the other hand, in the low power mode, the high power mode amplifier 11 does not operate, and only the low power mode amplifier 12 is operated. And, the power mode amplifier 12 gains a low power mode output impedance ($Z_{LPM}$) through the output impedance matching unit 18 and the common output impedance matching unit 19 of the low power mode amplifier 12.

Figure 2:
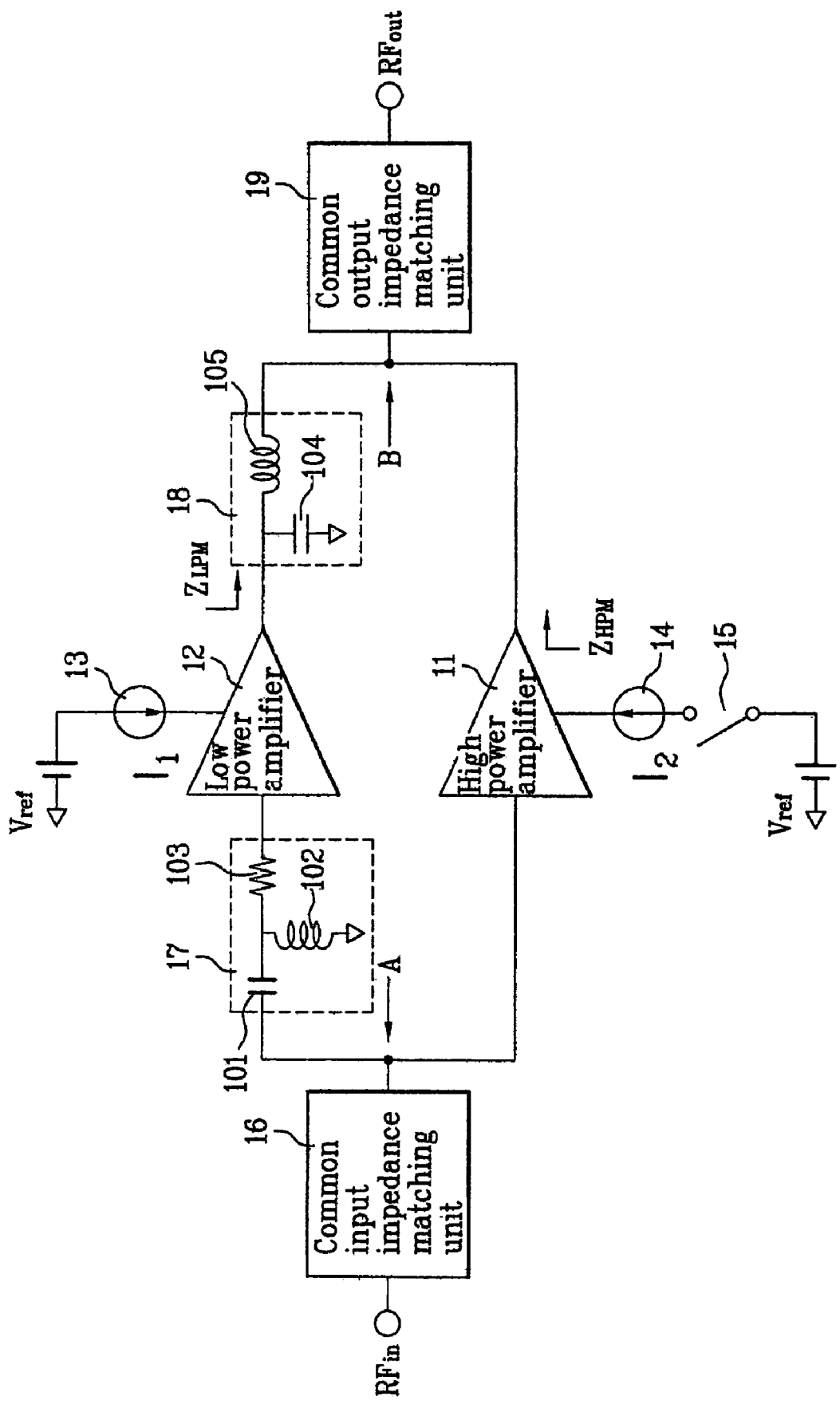
FIG. 2 illustrates a detailed view of input and output impedance matching units of FIG. 1.

FIG. 2 illustrates a schematic diagram of input and output impedance matching units of FIG. 1.

Referring to FIG. 2, the output impedance matching unit 18 is a low pass type represented by a parallel capacitor 104, having a negative phase shift (−Φ), and a series inductor 105 from the output unit of the low power mode amplifier 12.

Herein, the series inductor 105 is electrically connected between the input terminal and the output terminal of the output impedance matching unit 18. And, the parallel capacitor 104 is electrically connected between the input terminal and the ground terminal of the output impedance matching unit 18.

On the other hand, the input impedance matching unit 17 is a high pass type represented by a series capacitor 101, having a positive phase shift (+Φ), and a parallel inductor 102 from the input unit of the low power mode amplifier 12. In the low power mode, the input impedance matching unit 17 prevents oscillation from occurring, and a series resistance 103 is connected, so as to control the gain of the low power mode amplifier 12.

Herein, the series capacitor 101 and the series resistance 103 are connected in series between the input terminal and the output terminal of the input impedance matching unit 17. And, the parallel inductor 102 is electrically connected between the ground terminal and the common terminal of the series capacitor 101 and the series resistance 103.

Other operation principles are identical to those described in FIG. 1 and will, therefore, be omitted for simplicity.

Figure 3:
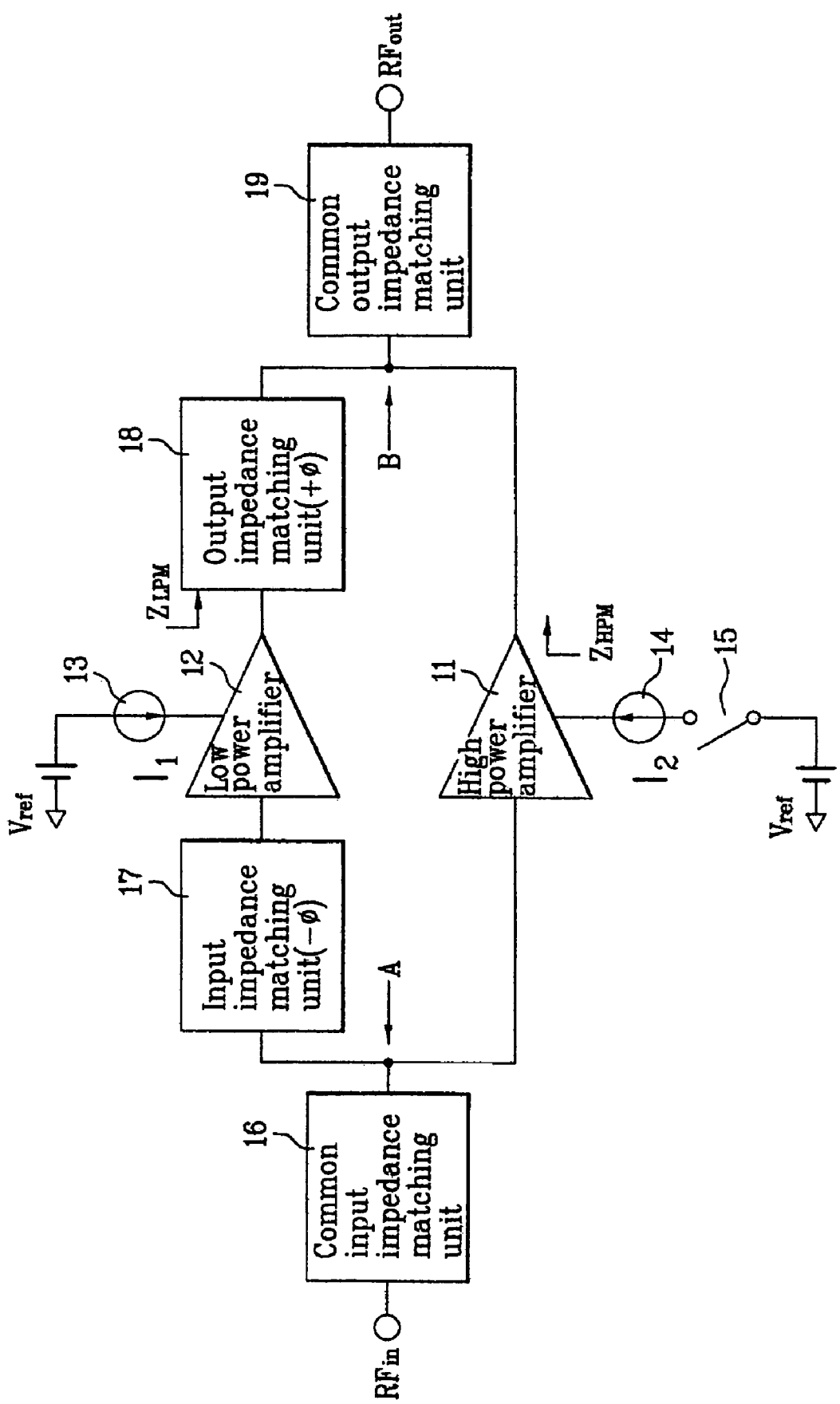
FIG. 3 illustrates a schematic view of a power amplifier according to a second embodiment of the present invention.

FIG. 3 illustrates a schematic view of a power amplifier according to a second embodiment of the present invention. FIG. 3 illustrates a phase shift opposite to that of the input and output impedance matching units shown in FIG. 1.

Referring to the FIG. 3, the output impedance matching unit 18 having a positive phase shift (+Φ) is electrically connected to the output unit of the low power mode amplifier 12. And, the input impedance matching unit 17 having a negative phase shift (−Φ) is electrically connected to the input unit of the low power mode amplifier 12.

The operation principle of the low power mode amplifier is identical to that described in FIG. 1 and will, therefore, be omitted for simplicity.

Figure 4:
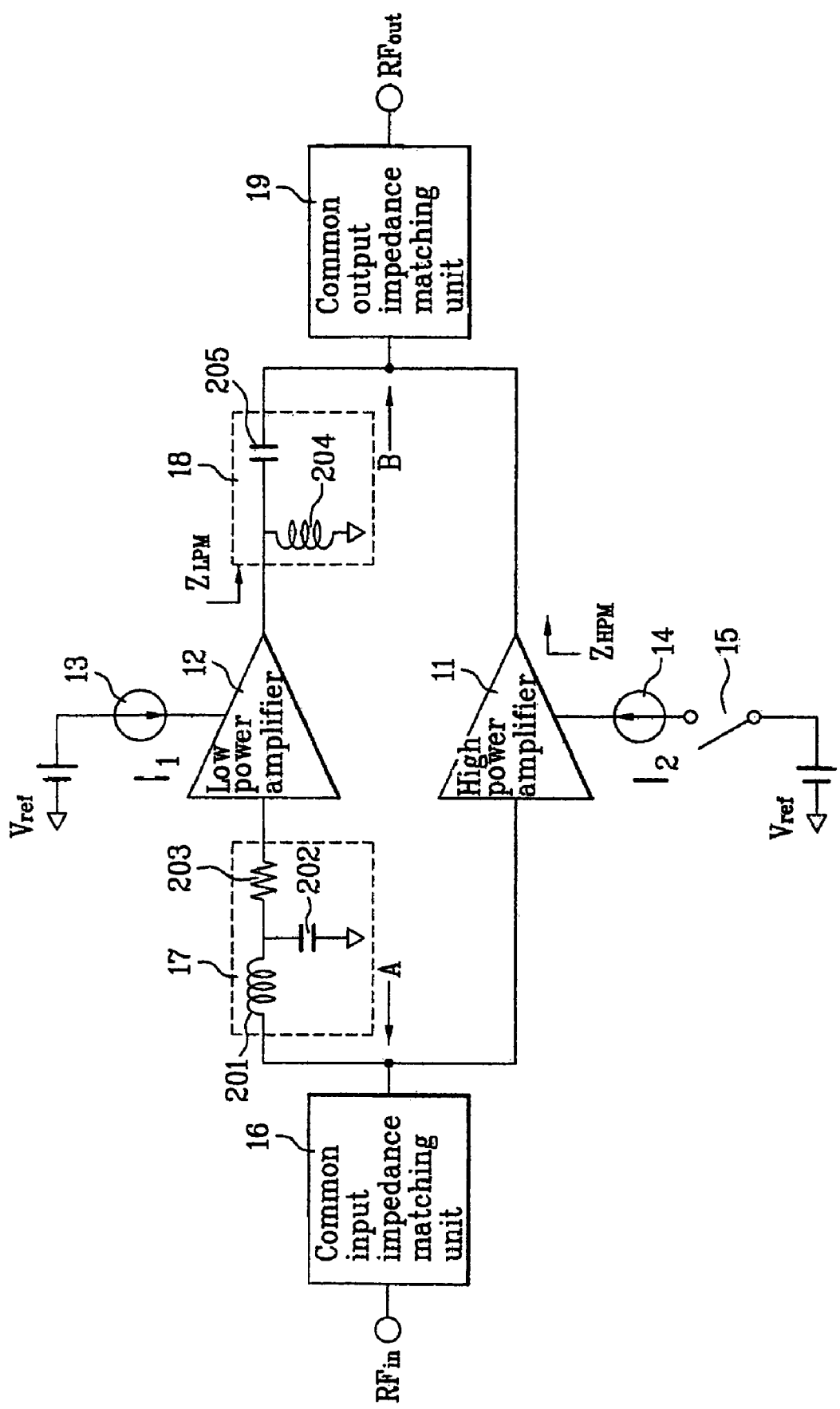
FIG. 4 illustrates a detailed view of input and output impedance matching units of FIG. 3.

FIG. 4 illustrates a detailed view of input and output impedance matching units of FIG. 3.

Referring to FIG. 4, the output impedance matching unit 18 is a high pass type represented by a series capacitor 205, having a positive phase shift (+Φ), and a parallel inductor 204 from the output unit of the low power mode amplifier 12. The series capacitor 205 is electrically connected between the input terminal and the output terminal of the output impedance matching unit 18. And, the parallel inductor 204 is electrically connected between the input terminal and the ground terminal of the output impedance matching unit 18.

On the other hand, the input impedance matching unit 17 is a low pass type represented by a series inductor 201, having a negative phase shift (−Φ), and a parallel capacitor 202 from the input unit of the low power mode amplifier 12. In the low power mode, the input impedance matching unit 17 prevents oscillation from occurring, and a series resistance 203 is connected, so as to control the gain of the low power mode amplifier 12.

Herein, the series inductor 201 and the series resistance 203 are electrically connected between the input terminal and the output terminal of the input impedance matching unit 17. And, the parallel capacitor 202 is electrically connected between the ground terminal and the common terminal of the series inductor 201 and the series resistance 203.

Other operation principles are identical to those described in FIG. 1 and will, therefore, be omitted for simplicity.

As described above, in the power amplifier according to the present invention, the gain and the maximum output of the low power mode amplifier 12 and the high power mode amplifier 11 are adequately decided in accordance with each mode and usage. However, the input and output phase difference between the amplifiers 11 and 12 is assumed to be identical.

In addition, the low power amplifier 12 and the high power amplifier 11 can be formed of the hetero junction bipolar transistor (HBT) array, and can also be formed of the bipolar junction transistor (BJT) array or the field effect transistor (FET) array.

Herein, when using the HBT array, the power used in the amplifier becomes the electric current source. On the other hand, when using either the BJT array or the FET array, the power used in the amplifier may become the voltage source.

In the present technology, the power amplifiers generally used in the mobile phones produce a maximum efficiency of only 10% in the low power mode.

However, the power amplifier according to the present invention has the following advantages.

An impedance matching unit is connected to each of the input and output units of the low power mode amplifiers, thereby controlling the maximum output and the maximum efficiency impedance of the power amplifier.

Moreover, by connecting the impedance matching unit to each of the input and output units of the low power mode amplifier, the amplification gain of the power amplifier can be controlled.

Furthermore, when operated in the high power mode, the signals outputted from the low power mode amplifier and the high power mode amplifier are matched to become signals having the same size and phase, thereby blocking the signal transmission between the two amplifiers. Accordingly, the maximum output power is increased, the linear characteristic is insured, and the power efficiency is enhanced.

Finally, the input and output impedance matching units depending upon the phase shifts are represented by the L-C impedance matching circuit, thereby being highly applicable to compact circuits, such as the microwave monolithic integrated circuit (MMIC).

Therefore, the power amplifier according to the present invention can be highly effective when used in mobile phones and personal digital assistants (PDAs) using batteries, and local area network (LAN) cards in laptop computers. The present invention can also be effectively used in all types of wired and wireless telecommunication systems without any limitation.

More specifically, the present invention can be effectively used in telecommunication systems seeking to enhance consumed power efficiency when operated at a low power mode and a high power mode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A power amplifier, comprising:
a first amplifier connected to a first power;
a second amplifier connected to a second power;
a common input impedance matching unit impedance matching inputted signals and outputting the inputted signals to the first amplifier and the second amplifier;
a common output impedance matching unit impedance matching and outputting the signals amplified from the first amplifier and the second amplifier;
an output impedance matching unit electrically connected between the first amplifier and the common output impedance matching unit, and modifying an output voltage value of the first amplifier to an output voltage value of the second amplifier;
an input impedance matching unit electrically connected between the common input impedance matching unit and the first amplifier, and compensating a phase shift occurring during the voltage modification of the output impedance matching unit; and
a switch connected between the second power and the second amplifier and configured to selectively provide the second power to the second amplifier,
wherein when the switch is switched to provide the second power to the second amplifier, the output impedance matching unit modifies the output voltage value of the first amplifier to be substantially the same as the output voltage value of the second amplifier.

2. The power amplifier according to claim 1, wherein the second power connected to the second amplifier is switched by the switch and provides an electric current to the second amplifier.

3. The power amplifier according to claim 1, wherein the first amplifier is a low power amplifier, and the second amplifier is a high power amplifier.

4. The power amplifier according to claim 1, wherein the first and second amplifiers are formed of a hetero junction bipolar transistor array, and each of the first and second powers is an electric current source.

5. The power amplifier according to claim 1, wherein the first and second amplifiers are formed of a field effect transistor array, and each of the first and second powers is a voltage source.

6. A power amplifier, comprising:
a first amplifier connected to a first power;
a second amplifier connected to a second power;
a common input impedance matching unit impedance matching inputted signals and outputting the inputted signals to the first amplifier and the second amplifier;
a common output impedance matching unit impedance matching and outputting the signals amplified from the first amplifier and the second amplifier;
an output impedance matching unit electrically connected between the first amplifier and the common output impedance matching unit, and modifying an output voltage value of the first amplifier to an output voltage value of the second amplifier; and
an input impedance matching unit electrically connected between the common input impedance matching unit and the first amplifier, and compensating a phase shift occurring during the voltage modification of the output impedance matching unit,
wherein the output impedance matching unit is a low pass type impedance matching circuit having a negative phase shift (−Φ), and the input impedance matching unit is a high pass type impedance matching circuit having a positive phase shift (+Φ).

7. The power amplifier according to claim 6, wherein the output impedance matching unit comprises:
an inductor connected in series between the first amplifier and the common output impedance matching unit; and
a capacitor connected between a node and a ground terminal, the node being formed between the first amplifier and the inductor.

8. The power amplifier according to claim 6, wherein the input impedance matching unit comprises:
a capacitor and a resistance connected in series between the common input impedance matching unit and the first amplifier; and
an inductor connected between a node and a ground terminal, the node being formed between the capacitor and the resistance.

9. A power amplifier, comprising:
a first amplifier connected to a first power;
a second amplifier connected to a second power;
a common input impedance matching unit impedance matching inputted signals and outputting the inputted signals to the first amplifier and the second amplifier;
a common output impedance matching unit impedance matching and outputting the signals amplified from the first amplifier and the second amplifier;
an output impedance matching unit electrically connected between the first amplifier and the common output impedance matching unit, and modifying an output voltage value of the first amplifier to an output voltage value of the second amplifier; and
an input impedance matching unit electrically connected between the common input impedance matching unit and the first amplifier, and compensating a phase shift occurring during the voltage modification of the output impedance matching unit,
wherein the output impedance matching unit is a high pass type impedance matching circuit having a positive phase shift (+Φ), and the input impedance matching unit is a low pass type impedance matching circuit having a negative phase shift (−Φ).

10. The power amplifier according to claim 9, wherein the output impedance matching unit comprises:
a capacitor connected in series between the first amplifier and the common output impedance matching unit; and
an inductor connected between a node and a ground terminal, the node being formed between the first amplifier and the inductor.

11. The power amplifier according to claim 9, wherein the input impedance matching unit comprises:
an inductor and a resistance connected in series between the common input impedance matching unit and the first amplifier; and
a capacitor connected between a node and a ground terminal, the node being formed between the inductor and the resistance.

12. A power amplifier, comprising:
a low power amplifier connected to a first power;
a high power amplifier connected to a second power being switched by a switch;
a common input impedance matching unit impedance matching inputted signals and outputting the inputted signals to the low power amplifier and the high power amplifier;
a common output impedance matching unit impedance matching and outputting the signals amplified from the low power amplifier and the high power amplifier;
a low pass type output impedance matching unit electrically connected between the low power amplifier and the common output impedance matching unit, and having a negative phase shift (−Φ) so as to modify an output voltage value of the low power amplifier to an output voltage value of the high power amplifier; and
a high pass type output impedance matching unit electrically connected between the common input impedance matching unit and the low power amplifier, and having a positive phase shift (+Φ) so as to compensate a phase shift occurring during the voltage modification of the output impedance matching unit.

13. The power amplifier according to claim 12, wherein the low power amplifier and the high power amplifier are formed of a hetero junction bipolar transistor array, and each of the first and second powers is an electric current source.

14. The power amplifier according to claim 12, wherein the low power amplifier and the high power amplifier are formed of a field effect transistor array, and each of the first and second powers is a voltage source.

15. The power amplifier according to claim 12, wherein the output impedance matching unit comprises:
an inductor connected in series between the low power amplifier and the common output impedance matching unit; and
a capacitor connected between a node and a ground terminal, the node being formed between the low power amplifier and the inductor.

16. The power amplifier according to claim 12, wherein the input impedance matching unit comprises:
- a capacitor and a resistance connected in series between the common input impedance matching unit and the low power amplifier; and
- an inductor connected between a node and a ground terminal, the node being formed between the capacitor and the resistance.

17. A power amplifier, comprising:
- a low power amplifier connected to a first power;
- a high power amplifier connected to a second power being switched by a switch;
- a common input impedance matching unit impedance matching inputted signals and outputting the inputted signals to the low power amplifier and the high power amplifier;
- a common output impedance matching unit impedance matching and outputting the signals amplified from the low power amplifier and the high power amplifier;
- a high pass type output impedance matching unit electrically connected between the low power amplifier and the common output impedance matching unit, and having a positive phase shift (+Φ) so as to modify an output voltage value of the low power amplifier to an output voltage value of the high power amplifier; and
- a low pass type input impedance matching unit electrically connected between the common input impedance matching unit and the low power amplifier, and having a negative phase shift (−Φ) so as to compensate a phase shift occurring during the voltage modification of the output impedance matching unit.

18. The power amplifier according to claim 17, wherein the output impedance matching unit comprises:
- a capacitor connected in series between the low power amplifier and the common output impedance matching units; and
- an inductor connected between a node and a ground terminal, the node being formed between the low power amplifier and the inductor.

19. The power amplifier according to claim 17, wherein the input impedance matching unit comprises:
- an inductor and a resistance connected in series between the common input impedance matching unit and the low power amplifier; and
- a capacitor connected between a node and a ground terminal, the node being formed between the inductor and the resistance.

20. The power amplifier according to claim 1, wherein when the switch is switched to provide the second power to the second amplifier, the input impedance matching unit compensates the phase shift occurring during the voltage modification of the output impedance matching unit such that the output voltage values of the first and second amplifiers are substantially the same.

* * * * *